US012584213B2

(12) United States Patent
Kano et al.

(10) Patent No.: US 12,584,213 B2
(45) Date of Patent: Mar. 24, 2026

(54) HEAT-RESISTANT COAT MEMBER PACKAGED BODY, AND METHOD FOR PACKAGING HEAT-RESISTANT COAT MEMBER

(71) Applicant: SHIN-ETSU CHEMICAL CO., LTD., Tokyo (JP)

(72) Inventors: Shoji Kano, Takasaki (JP); Waichi Yamamura, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 96 days.

(21) Appl. No.: 18/043,371

(22) PCT Filed: Aug. 30, 2021

(86) PCT No.: PCT/JP2021/031800
§ 371 (c)(1),
(2) Date: Feb. 28, 2023

(87) PCT Pub. No.: WO2022/050238
PCT Pub. Date: Mar. 10, 2022

(65) Prior Publication Data
US 2023/0304148 A1 Sep. 28, 2023

(30) Foreign Application Priority Data
Sep. 1, 2020 (JP) ................................. 2020-146819

(51) Int. Cl.
| | |
|---|---|
| *B32B 9/00* | (2006.01) |
| *B65D 81/18* | (2006.01) |
| *B65D 81/20* | (2006.01) |
| *C23C 16/34* | (2006.01) |

(52) U.S. Cl.
CPC .............. *C23C 16/34* (2013.01); *B32B 9/007* (2013.01); *B65D 81/18* (2013.01); *B65D 81/20* (2013.01); *B65D 81/2023* (2013.01); *B32B 9/00* (2013.01); *B32B 2307/7246* (2013.01); *B65D 81/2007* (2013.01)

(58) Field of Classification Search
CPC ...... B32B 2307/7246; B32B 2307/538; C23C 14/0647
USPC .............................................. 428/34.1–36.92
See application file for complete search history.

(56) References Cited

U.S. PATENT DOCUMENTS

| | | | | |
|---|---|---|---|---|
| 5,607,775 | A * | 3/1997 | Kimura ................. | C04B 35/583 428/457 |
| 6,524,719 | B1 * | 2/2003 | Yamane ................. | B32B 27/36 428/474.9 |
| 2009/0249747 | A1 | 10/2009 | Nishiura et al. | |
| 2010/0015431 | A1 * | 1/2010 | Matsui .................... | B32B 33/00 428/323 |
| 2010/0247886 | A1 * | 9/2010 | Lee .......................... | B32B 27/18 156/244.11 |
| 2011/0052867 | A1 * | 3/2011 | Yamamura ............ | B32B 27/306 428/141 |
| 2011/0155593 | A1 * | 6/2011 | Zhang ................... | B65D 81/268 206/349 |
| 2012/0045380 | A1 | 2/2012 | Satoh et al. | |
| 2013/0302616 | A1 | 11/2013 | Kano | |
| 2014/0373485 | A1 * | 12/2014 | Okada .................... | B65D 81/26 604/199 |

FOREIGN PATENT DOCUMENTS

| | | | |
|---|---|---|---|
| CN | 203715790 U | 7/2014 | |
| JP | 7-89776 A | 4/1995 | |
| JP | H0789776 A | * 4/1995 | |
| JP | 2002-27 4594 A | 9/2002 | |
| JP | 2005-112447 A | 4/2005 | |
| JP | 2008-267797 A | 11/2008 | |
| JP | 2009-248976 A | 10/2009 | |
| JP | 2013203436 A | * 10/2013 | |
| JP | 2016-178857 A | 10/2016 | |
| JP | 2019-99453 A | 6/2019 | |
| WO | WO 2011/043428 A1 | 4/2011 | |
| WO | WO 2011/062003 A1 | 5/2011 | |
| WO | WO-2014088219 A1 | * 6/2014 ........... | B31D 5/0073 |

OTHER PUBLICATIONS

WO 2014088219 A1, English Translated (Year: 2014).*
Japanese Decision to Grant issued Aug. 22, 2023 in Japanese Application No. 2020-146819, 4 pgs.
International Search Report issued Oct. 26, 2021 in PCT/JP2021/031800 filed on Aug. 30, 2021, 2 pages.
Office Action issued Mar. 28, 2023, in corresponding Japanese Patent Application No. 2020-146819, 4 pages.

* cited by examiner

*Primary Examiner* — Michael C. Romanowski
(74) *Attorney, Agent, or Firm* — Oblon, McClelland, Maier & Neustadt, L.L.P.

(57) ABSTRACT

The present invention relates to a heat-resistant coat member packaged body including: a heat-resistant coat member formed by coating a substrate with a heat-resistant material; and a bag member that accommodates the heat-resistant coat member wherein the bag member has a water vapor permeability of 0.3 g/m²·day or less. The present invention also relates to a method for packaging a heat-resistant coat member, including packaging a heat-resistant coat member obtained by coating a substrate with a heat-resistant material with a bag member having a water vapor permeability of 0.3 g/m²·day or less. According to the present invention, it is possible to provide a heat-resistant coat member packaged body capable of obtaining a heat-resistant coat member in which peeling of a heat-resistant material coating a substrate can be suppressed even when heated after being stored for a long period of time, and a method for packaging the heat-resistant coat member.

5 Claims, No Drawings

HEAT-RESISTANT COAT MEMBER PACKAGED BODY, AND METHOD FOR PACKAGING HEAT-RESISTANT COAT MEMBER

TECHNICAL FIELD

The present invention relates to a heat-resistant coat member packaged body containing a heat-resistant coat member formed by coating a substrate with a heat-resistant material and a bag member that accommodates the heat-resistant coat member, and a method for packaging the heat-resistant coat member.

BACKGROUND ART

A coated carbon material obtained by coating a carbon substrate with a heat-resistant material such as pyrolytic boron nitride, carbon-added pyrolytic boron nitride, pyrolytic carbon, boron-added pyrolytic boron nitride, SiC, and TaC is known as a conventional technique (for example, see PTLs 1 to 3). The coated carbon material is excellent in heat resistance and chemical stability, and is particularly suitably used as a heat-resistant jig for use in a process in which carbon is rapidly consumed by a reducing gas or a reactive gas. Since a jig having a free shape can be obtained by using the coated carbon material, the applicable range of the coated carbon material is wide, and the jig using the coated carbon material covers a wide variety of uses. For example, the coated carbon material is used in a wafer tray, a raw material-melting crucible, a heating source, a reaction container, a heat-shielding member, a crucible for pulling a single crystal, and the like, which are used in a semiconductor-manufacturing process.

As a general method for coating a carbon substrate with a heat-resistant material in order to obtain a coated carbon material, an arc ion plating (AIP) type reactive vapor deposition method, a reactive PVD method, a chemical vapor deposition (CVD) method, and the like are known. When the carbon substrate is coated with the heat-resistant material, a portion in contact with the substrate supporting portion becomes an uncoated portion. Therefore, in general, it is preferable that the carbon substrate is coated with the heat-resistant material once and then taken out, the portion of the carbon substrate in contact with the supporting portion is changed, and the carbon substrate is further coated with the heat-resistant material once or more. For example, in the case of a flat carbon substrate, after the carbon substrate is coated with the heat-resistant material once, the carbon substrate is taken out, turned over, and set again, and then the carbon substrate is coated with the heat-resistant material once.

The coated carbon material obtained by coating the carbon substrate with the heat-resistant material as described above is usually packaged in a polyethylene bag so as not to be contaminated and shipped to a user. The coated carbon material packaged in the polyethylene bag is usually opened and used in a relatively short period of time (for example, after a lapse of several days to several months) after shipment. The polyethylene bag has such excellent characteristics that (1) it can be easily produced from raw material pellets at low cost, (2) it has relatively general versatility in physical properties such as transparency, strength, moisture resistance, gas permeability, and chemical resistance, (3) it is excellent in heat sealability, and (4) it has little difference in hardness and softness depending on temperature.

CITATION LIST

Patent Literature

PTL 1: JP 7-89776 A
PTL 2: JP 2019-99453 A
PTL 3: WO 2011/043428 A1

SUMMARY OF INVENTION

Technical Problem

The coated carbon material was not particularly problematic as long as it was opened and used in a relatively short period of time after shipment. However, in a case where the coated carbon material is stored for a long period of time (six months to several years) after shipment, when the coated carbon material is heated, the coating layer formed by the first coating or the coating layer formed by the second coating may be peeled off.

Therefore, an object of the present invention is to provide a heat-resistant coat member packaged body capable of obtaining a heat-resistant coat member in which peeling of a heat-resistant material coating a substrate can be suppressed even when heated after being stored for a long period of time, and a method for packaging the heat-resistant coat member.

Solution to Problem

As a result of intensive studies, the present inventors have found that, while a heat-resistant coat member packaged in a polyethylene bag is stored for a long period of time, moisture that has passed through the polyethylene bag is adsorbed on a substrate, and when the heat-resistant coat member is heated, the moisture adsorbed on the substrate is gasified, which may cause peeling of a heat-resistant material, and have completed the present invention. The gist of the present invention is as follows. Since polyethylene is non-polar, it allows a gas of a non-polar material such as aliphatic hydrocarbon to pass through well, but has an excellent shielding property against water vapor having polarity. For this reason, it has not been conventionally considered that the cause of the peeling of the heat-resistant material is the moisture having passed through the polyethylene bag.

[1] A heat-resistant coat member packaged body including: a heat-resistant coat member formed by coating a substrate with a heat-resistant material; and a bag member that accommodates the heat-resistant coat member, in which the bag member has a water vapor permeability of 0.3 $g/m^2 \cdot day$ or less.

[2] The heat-resistant coat member packaged body as set forth in [1], in which the heat-resistant coat member is a heat-resistant coat member formed by coating the substrate with the heat-resistant material two or more times.

[3] The heat-resistant coat member packaged body as set forth in [1] or [2], in which the substrate is composed of at least one material selected from the group consisting of pyrolytic boron nitride and graphite.

[4] The heat-resistant coat member packaged body as set forth in any one of [1] to [3], in which the heat-resistant material is at least one heat-resistant material selected from the group consisting of pyrolytic boron nitride, carbon-added pyrolytic boron nitride, pyrolytic carbon, boron-added pyrolytic boron nitride, SiC, and TaC.

[5] The heat-resistant coat member packaged body as set forth in any one of [1] to [4], in which the bag member is formed of a gas barrier film obtained by depositing at least one selected from the group consisting of aluminum, alumina, and silica on a plastic film.

[6] The heat-resistant coat member packaged body as set forth in any one of [1] to [5], in which the inner surface of the bag member has an average roughness of 13 μm or less.

[7] A method for packaging a heat-resistant coat member, including packaging a heat-resistant coat member obtained by coating a substrate with a heat-resistant material with a bag member having a water vapor permeability of 0.3 g/m²·day or less.

Advantageous Effects of Invention

According to the present invention, it is possible to provide a heat-resistant coat member packaged body capable of obtaining a heat-resistant coat member in which peeling of a heat-resistant material coating a substrate can be suppressed even when heated after being stored for a long period of time, and a method for packaging the heat-resistant coat member.

DESCRIPTION OF EMBODIMENTS

[Heat-Resistant Coat Member Packaged Body]

The heat-resistant coat member packaged body of the present invention includes a heat-resistant coat member and a bag member.

(Heat-Resistant Coat Member)

The heat-resistant coat member in the heat-resistant coat member packaged body of the present invention is formed by coating a substrate with a heat-resistant material. The heat-resistant material is not particularly limited as long as it has excellent heat resistance, and examples of the heat-resistant material include pyrolytic boron nitride, carbon-added pyrolytic boron nitride, pyrolytic carbon, boron-added pyrolytic boron nitride, SiC, and TaC. These heat-resistant materials can be used alone or in combination of two or more thereof. These heat-resistant materials can coat a substrate by, for example, a chemical vapor deposition (CVD) method. By the CVD method, even when the substrate has a complicated shape, the substrate can be coated with a heat-resistant material having a uniform film thickness. Examples of the CVD method include a thermal CVD method, a plasma CVD method, and a laser CVD method. Among these, the thermal CVD method is preferable from the viewpoint of mass productivity. Examples of the thermal CVD method include an atmospheric pressure method and a reduced pressure method. Among these, the reduced pressure method is preferable from the viewpoint of the uniformity of the film thickness.

The substrate is not particularly limited, and examples of the substrate include pyrolytic boron nitride and graphite.

The substrate of pyrolytic boron nitride can be produced, for example, in the following manner. A high purity raw material gas of five nines to six nines is deposited and reacted on a carbon jig in a reduced pressure atmosphere at 2000° C. to form a film of pyrolytic boron nitride. Then, the film of pyrolytic boron nitride is thickened while being reacted and laminated in a layered manner to produce a substrate of pyrolytic boron nitride. Since the thermal expansion coefficient of pyrolytic boron nitride is different from that of carbon, the substrate of the produced pyrolytic boron nitride can be removed from the carbon jig by utilizing the difference. The substrate of pyrolytic boron nitride is characterized in that it has high strength, high electrical insulation, and high purity with a metal impurity of 1 ppm or less.

The substrate of graphite can be produced, for example, by molding a thermosetting resin such as a phenol resin, a furfuryl alcohol resin, or a furan resin into a predetermined shape, then polymerizing and thermally curing the resin, taking out the molded body from the mold, then further machining the molded body, and carbonizing and graphitizing the molded body. Machining may be performed after graphitization. The substrate of graphite is characterized by high purity, a dense structure, and excellent chemical corrosion resistance.

Specifically, for example, when the heat-resistant material is pyrolytic boron nitride and the substrate is graphite, the heat-resistant coat member can be produced in the following manner.

First, a graphite substrate having a desired shape is prepared, and the graphite substrate is placed on a substrate supporting portion of a CVD apparatus. Then, ammonia ($NH_3$) and boron trichloride ($BCl_3$) are reacted at a high temperature of 1900° C. by a CVD method to coat the surface of the graphite substrate with pyrolytic boron nitride. Next, the portion of the graphite substrate in contact with the substrate supporting portion is changed, and the graphite substrate is placed again on the substrate supporting portion of the CVD apparatus. The graphite substrate is coated again with pyrolytic boron nitride by the CVD method.

The heat-resistant material coating the substrate is preferably 0.01 mm or more and 1.0 mm or less, and more preferably 0.03 mm or more and 0.2 mm or less. When the thickness of the heat-resistant material is 0.01 mm or more, the heat resistance of the substrate can be further improved. When the thickness of the heat-resistant material is 1 mm or less, it is possible to suppress an increase in film formation rate, particularly at a corner portion or the like, and an increase in film thickness distribution. In addition, when the thickness of the heat-resistant material is 1 mm or less, it is possible to suppress peeling of the heat-resistant material from the substrate due to a difference in thermal expansion coefficient between the substrate and the heat-resistant material.

The heat-resistant coat member is preferably formed by coating the substrate with the heat-resistant material two or more times. As described above, when the substrate is coated with the heat-resistant material, a portion that comes into contact with the substrate supporting portion is an uncoated portion. Therefore, by coating the substrate with the heat-resistant material two or more times, it is possible to prevent the occurrence of an uncoated portion of the heat-resistant material.

(Bag Member)

The bag member accommodates the heat-resistant coat member. The water vapor permeability of the bag member is 0.3 g/m²·day or less. When the water vapor permeability of the bag member is more than 0.3 g/m²·day, the heat-resistant material may peel off when the heat-resistant coat member accommodated in the bag member and stored for a long period of time is heated. In addition, the water vapor permeability of the bag member is measured in accordance with the standard of JIS K 7129, and is a value tested under conditions of 40° C. and 90% humidity. In addition, the water vapor permeability of polyethylene, which has been conventionally used as a bag member for accommodating a heat-resistant coat member, is about 0.4 to 5 g/m²·day. From the viewpoint of preventing the entry of water vapor into the bag member, it is preferable to seal the bag member accommodating the heat-resistant coat member using a device such as a heat-sealing sealer.

From the viewpoint of productivity, the bag member is preferably composed of a gas barrier film obtained by depositing at least one material selected from the group consisting of aluminum, alumina, and silica on a plastic film. Such a gas barrier film can be produced, for example, in the following manner. At least one barrier material selected from the group consisting of aluminum, alumina, and silica is melted in a vacuum by high-frequency heating or an electron gun (EB gun), and a film of the barrier material is formed on a plastic film on which vapor of the melted barrier material continuously flows. Examples of the plastic film include a nylon film and a polyester film. In order to further reduce the water vapor permeability of the gas barrier film, the film may be formed while assisting energy such as plasma or ions in the vapor of the barrier material (plasma-assisted vapor deposition). Among aluminum, alumina, and silica, aluminum is more preferable from the viewpoint of gas barrier properties. On the other hand, among these materials, alumina and silica are more preferable from the viewpoint of good light transmittance.

The average roughness of the inner surface of the bag member is preferably 13 μm or less. When the average roughness of the inner surface of the bag member is 13 μm or less, it is possible to suppress the occurrence of scratches on the surface of the heat-resistant coat member due to the contact of the surface of the heat-resistant coat member with the bag member. From such a viewpoint, the average roughness of the inner surface of the bag member is more preferably 10 μm or less, still more preferably 5 μm or less, and even more preferably 2 μm or less. The average roughness of the inner surface of the bag member is an arithmetic average roughness (Ra) measured according to the standard of JIS B 0601. In addition, when the average roughness of the inner surface of the bag member is set to 13 μm or less, the surfaces of the films constituting the bag member adhere to each other and are not easily peeled off. Therefore, in general, the average roughness of the inner surface of the bag member is not set to 13 μm or less.

In order to further suppress the adsorption of moisture to the substrate during storage for a long period of time, it is preferable to house the heat-resistant coat member in a bag member, evacuate the inside of the bag member to remove air from the inside of the bag member, and then seal the bag member using a device such as a heat-sealing sealer. Alternatively, after the inside of the bag member is evacuated, the bag member may be filled with dry air or nitrogen having a dew point of −40° C. or lower, and then sealed using a device such as a heat-sealing sealer. Further, after the inside of the bag member is evacuated, dry air or nitrogen having a dew point of −40° C. or lower may be filled in the bag member, and after the inside of the bag member is further evacuated, the bag member may be sealed by using a device such as a heat-sealing sealer.

In another aspect, the heat-resistant coat member may be put into a polyethylene bag first, and then the polyethylene bag accommodating the heat-resistant coat member may be put into the bag member. Alternatively, the heat-resistant coat member may be put into the polyethylene bag first, and the polyethylene bag accommodating the heat-resistant coat member may be put into the bag member after sealing with a device such as a heat-sealing sealer, and the bag member may be sealed. Further, after the heat-resistant coat member is first put into the polyethylene bag, the inside of the bag is evacuated to remove air from the bag, and the bag is sealed using a device such as a heat-sealing sealer, the polyethylene bag accommodating the heat-resistant coat member may be put into the bag member, the inside of the bag member is evacuated, and then the bag member may be sealed. Furthermore, also in this case, the inside of the polyethylene bag and the bag member may be evacuated and then filled with dry air or nitrogen having a dew point of −40° C. or lower, and then sealed using a device such as a heat-sealing sealer, or the inside of the polyethylene bag and the bag member may be evacuated and then filled with dry air or nitrogen having a dew point of −40° C. or lower, and then the inside of the polyethylene bag and the bag member may further be evacuated and sealed.

As still another aspect, in a case where the heat-resistant coat member is not in close contact with the bag member, the heat-resistant coat member may be accommodated in a hard case, and the hard case into which the heat-resistant coat member has been put may be accommodated in the bag member. Alternatively, the heat-resistant coat member may be put into a hard case, and the hard case into which the heat-resistant coat member has been put may be put into the bag member, and then the bag member may be sealed by using a device such as a heat-sealing sealer. Further, a heat-resistant coat member may be put into a hard case, the hard case into which the heat-resistant coat member has been put may be put into a bag member, the inside of the bag member may be evacuated to remove air in the bag, and the bag may be sealed using a device such as a heat-sealing sealer. In addition, similarly to the above-described aspect, the hard case into which the heat-resistant coat member has been put may be put into the polyethylene bag, or the polyethylene bag may be evacuated and then filled with dry air or nitrogen having a dew point of −40° C. or lower, or the polyethylene bag may be evacuated and then filled with dry air or nitrogen having a dew point of −40° C. or lower, and then further evacuated.

From the viewpoint of further reducing the permeation of the water vapor, it is preferable that after the heat-resistant coat member is accommodated in the polyethylene bag, the polyethylene bag accommodating the heat-resistant coat member is accommodated in the bag member. In this case, since the heat-resistant coat member is in contact with the polyethylene bag, the average roughness of the inner surfaces of the polyethylene bag is preferably 13 μm or less, more preferably 10 μm or less, still more preferably 5 μm or less, and even more preferably 2 μm or less. The polyethylene bag is not particularly limited as long as it is a polyethylene bag used for packaging applications, and examples of the polyethylene bag include a high-pressure low-density polyethylene bag and a linear low-density polyethylene bag.

In both of a case where the heat-resistant coat member is accommodated in the polyethylene bag and the polyethylene bag accommodating the heat-resistant coat member is accommodated in the bag member and a case where the heat-resistant coat member is accommodated in the hard case and the hard case accommodating the heat-resistant coat member is accommodated in the bag member, the heat-resistant coat member is eventually accommodated in the bag member, and thus it can be said that the heat-resistant coat member is accommodated in the bag member.

Even in the heat-resistant coat member accommodated in the polyethylene bag only and stored for a long period of time, peeling of the heat-resistant material can be suppressed by performing a baking treatment very slowly. However, by accommodating the heat-resistant coat member in the bag member having a water vapor permeability of 0.3 g/m$^2$·day or less, the labor of the baking treatment described above is eliminated, and the peeling of the heat-resistant material can be further suppressed as compared with the case where the baking treatment is performed.

In the case where the heat-resistant coat member is packaged only by the polyethylene bag packaging, when the packaged body is stored in the atmosphere for a long period of time, it is considered that the water vapor in the atmosphere passes through the polyethylene bag and the water vapor penetrates into the substrate of the heat-resistant coat member. In particular, if the heat-resistant coat member has a portion not coated with the heat-resistant material, it is considered that the water vapor may penetrate into the substrate from that portion. Also from such a viewpoint, the heat-resistant coat member is preferably formed by coating the substrate with the heat-resistant material two or more times. As moisture penetrates the substrate over a long period of time, the moisture concentration of the substrate is increased. When a heat-resistant coat member having a high moisture concentration of the substrate is exposed to a high temperature, it is considered that the moisture penetrating and accumulated in the substrate vaporizes and expands to rapidly increase the pressure between the heat-resistant material and the substrate, thereby causing peeling of the heat-resistant material. For this reason, it is considered that peeling of the heat-resistant material could be suppressed by the slow baking treatment.

The heat-resistant coat member in the heat-resistant coat member packaged body of the present invention can be used as an excellent heat-resistant and corrosion-resistant member that can withstand a process in which an HCl dry etching treatment is performed in a high-temperature environment in a semiconductor production apparatus. In particular, it can be used as a member that requires heat-resistant and corrosion-resistant properties, such as a wafer tray, a raw material melting crucible, a heating source such as a resistance heating heater, a reaction container, a heat-shielding member, and a crucible for pulling a single crystal. The heat-resistant coat member packaged body of the present invention allows such members to be safely used even after storage for a long period of time. In other words, according to the heat-resistant coat member packaged body of the present invention, even when the heat-resistant coat member is stored for a long period of time, it is possible to use the packaged body at a high temperature immediately after attaching the packaged body to the apparatus, and a prior heating and drying treatment step or a vacuum drying treatment step is unnecessary.

[Method for Packaging Heat-Resistant Coat Member]

In the method for packaging the heat-resistant coat member, the heat-resistant coat member formed by coating a substrate with a heat-resistant material is packaged with a bag member having a water vapor permeability of 0.3 g/m$^2$·day or less. Since the details of the heat-resistant coat member packaging method of the present invention have already been described in the section of [Heat-Resistant Coat Member Packaged Body] of the present invention, a detailed description of the heat-resistant coat member packaging method of the present invention will be omitted.

EXAMPLES

Hereinafter, the present invention will be described in more detail with reference to examples, but the present invention is not limited thereto.

Example 1

Ten pieces of wafer tray substrate in which isotropic graphite was formed to have an outer size of φ 100 mm×10 mm by mechanical grinding were prepared. These wafer tray substrates were put into a high-temperature vapor deposition furnace and set on three supporting rods, respectively, and the inside of the furnace was evacuated by a vacuum pump and heated to 1900° C. in a vacuum state to cause boron trichloride and ammonia to react with each other to form a pyrolytic boron nitride film having a thickness of 0.3 mm, thereby producing a heat-resistant coat member. The heat-resistant coat member taken out of the high-temperature vapor deposition furnace was put into an aluminum-deposited laminate bag having a water vapor permeability of 0.3 g/m$^2$·day (two or three types of nylon film, polyethylene film, and polyester film were stacked in multiple layers, and aluminum was deposited between the multiple layers), and the aluminum-deposited laminate bag was heat-sealed and hermetically packaged with a heat-sealing sealer while evacuating the inside of the aluminum-deposited laminate bag, thereby producing a heat-resistant coat member packaged body of Example 1. The surface roughness of the inner surface of the aluminum-deposited laminate bag was 10 μm.

The heat-resistant coat member packaged body of Example 1 was subjected to an accelerated test in which it was left in an environment tester at a temperature of 40° C. and a humidity of 90% for one month. Thereafter, the aluminum-deposited laminate bag was opened, and the heat-resistant coat member was put into a vapor deposition apparatus and heated to 200° C. at a temperature increase rate of 20° C./min. As a result, peeling of the pyrolytic boron nitride film did not occur in all of the ten pieces of heat-resistant coat member. In addition, there was no trace of rubbing with the aluminum-deposited laminate bag on the surfaces of the heat-resistant coat member.

Example 2

Ten pieces of wafer tray substrate were put into a high-temperature vapor deposition furnace and set on three supporting rods, respectively, and the inside of the furnace was evacuated by a vacuum pump and heated to 1900° C. in a vacuum state to cause boron trichloride and ammonia to react with each other, thereby forming a pyrolytic boron nitride film having a thickness of 0.3 mm. Thereafter, the wafer tray substrate coated with the pyrolytic boron nitride was inverted and set on the three supporting rods, the inside of the furnace was evacuated by a vacuum pump and heated to 1900° C. in a vacuum state to cause boron trichloride and ammonia to react with each other, thereby forming a pyrolytic boron nitride film having a thickness of 0.3 mm. In addition, the surface roughness of the inner surface of the aluminum-deposited laminate bag was 2 μm. A heat-resistant coat member packaged body of Example 2 was produced in the same manner as the heat-resistant coat member packaged body of Example 1, except for the above.

The heat-resistant coat member packaged body of Example 2 was subjected to an accelerated test in which it was left in an environment tester at a temperature of 40° C. and a humidity of 90% for one month. Thereafter, the aluminum-deposited laminate bag was opened, and the heat-resistant coat member was put into a vapor deposition apparatus and heated to 200° C. at a temperature increase rate of 20° C./min. As a result, peeling of the pyrolytic boron nitride film did not occur in all of the ten pieces of heat-resistant coat member. In addition, there was no trace of rubbing with the aluminum-deposited laminate bag on the surfaces of the heat-resistant coat member.

Example 3

Ten pieces of heater substrate having a spiral shape were prepared by mechanical grinding of isotropic graphite. These heater substrates were put into a high-temperature vapor deposition furnace and set on ten supporting rods, respectively, and the inside of the furnace was evacuated by a vacuum pump and heated to 1900° C. in a vacuum state to cause boron trichloride and ammonia to react with each other, thereby forming a pyrolytic boron nitride film having a thickness of 0.3 mm. Thereafter, the heater substrate coated with the pyrolytic boron nitride was inverted and set on the ten supporting rods, and the same film formation was performed to produce a heat-resistant coat member. In order not to form a film on the portion of the power supply terminal of the heater, a mask was attached in advance to the portion of the power supply terminal of the heater. The heat-resistant coat member was put into an aluminum-deposited laminate bag having a water vapor permeability of 0.3 g/m²·day, and hermetically sealed and packaged by heat-sealing with a sealer to produce a heat-resistant coat member packaged body of Example 3.

The heat-resistant coat member packaged body of Example 3 was subjected to an accelerated test in which it was left in an environment tester at a temperature of 40° C. and a humidity of 90% for one month. Thereafter, the aluminum-deposited laminate bag was opened, and the heat-resistant coat member was set in a film forming apparatus and electrically heated to 1000° C. at a temperature increase rate of 20° C./min. As a result, peeling of the pyrolytic boron nitride film did not occur in all of the ten pieces of heat-resistant coat member.

Comparative Examples 1 and 2 and Reference Example 1

In the same manner as in Example 1, a wafer tray substrate was coated with a pyrolytic boron nitride film, and 30 pieces of heat-resistant coat member were produced. Of these 30 pieces of heat-resistant coat member, 10 pieces of heat-resistant coat member were each put into a polyethylene bag having a water vapor permeability of 0.4 g/m²·day, and the polyethylene bag was hermetically sealed and packaged by heat-sealing with a heat-sealing sealer while evacuating the inside of the polyethylene bag, thereby producing a heat-resistant coat member packaged body of Comparative Example 1. The surface roughness of the inner surface of the polyethylene bag was 15 µm.

In addition, of the 30 pieces of heat-resistant coat member, the other 10 pieces of heat-resistant coat member were each put into a polyethylene bag having a water vapor permeability of 1 g/m²·day, and hermetically sealed and packaged by heat-sealing with a heat-sealing sealer while evacuating the inside of the polyethylene bag, thereby producing a heat-resistant coat member packaged body of Comparative Example 2. The surface roughness of the inner surface of the polyethylene bag was 15 µm.

The heat-resistant coat members of Comparative Example 1 and Comparative Example 2 were subjected to an accelerated test in which they were left in an environment tester at a temperature of 40° C. and a humidity of 90% for one month.

Of the 30 pieces of heat-resistant coat member, the remaining 10 pieces of heat-resistant coat member were not accommodated in a bag, and were subjected to an accelerated test in which they were left in an environment tester at a temperature of 40° C. and a humidity of 90% for one month (heat-resistant coat member of Reference Example 1).

With respect to the heat-resistant coat member packaged bodies of Comparative Example 1 and Comparative Example 2, the polyethylene bag was opened, the heat-resistant coat member was put into a vapor deposition apparatus and heated to 200° C. at a temperature increase rate of 20° C./min. As a result, with respect to the heat-resistant coat member packaged body of Comparative Example 1, peeling of the pyrolytic boron nitride film occurred in one out of ten pieces of heat-resistant coat member. In addition, a mark of rubbing with the polyethylene bag was visually observed on the heat-resistant coat member. On the other hand, with respect to the heat-resistant coat member packaged body of Comparative Example 2, peeling of the pyrolytic boron nitride film occurred in three out of ten pieces of heat-resistant coat member. In addition, a trace of rubbing with the polyethylene bag was visually observed on the heat-resistant coat member.

The heat-resistant coat member of Reference Example 1 was put into a vapor deposition apparatus and heated to 200° C. at a temperature increase rate of 2° C./min. As a result, peeling of the pyrolytic boron nitride film did not occur in all of the ten pieces of heat-resistant coat member of Reference Example 1. In this case, the time required to raise the temperature to 200° C. was about 10 times the time required to raise the temperature to 200° C. in Example 1.

Comparative Examples 3 and 4 and Reference Example 2

In the same manner as in Example 2, a wafer tray substrate was coated with a pyrolytic boron nitride film, and 30 pieces of heat-resistant coat member were produced. Of these 30 pieces of heat-resistant coat member, 10 pieces of heat-resistant coat member were each put into a polyethylene bag having a water vapor permeability of 0.4 g/m²·day respectively, and the polyethylene bag was hermetically sealed and packaged by heat-sealing with a heat-sealing sealer while evacuating the inside of the polyethylene bag, thereby producing a heat-resistant coat member packaged body of Comparative Example 3. The surface roughness of the inner surface of the polyethylene bag was 50 µm.

In addition, of the 30 pieces of heat-resistant coat member, the other 10 pieces of heat-resistant coat member were each put into a polyethylene bag having a water vapor permeability of 1 g/m²·day, and hermetically sealed and packaged by heat-sealing with a heat-sealing sealer while evacuating the inside of the polyethylene bag, thereby producing a heat-resistant coat member packaged body of Comparative Example 4. The surface roughness of the inner surface of the polyethylene bag was 50 µm.

The heat-resistant coat members of Comparative Example 3 and Comparative Example 4 were subjected to an accelerated test in which they were left in an environment tester at a temperature of 40° C. and a humidity of 90% for one month.

Of the 30 pieces of heat-resistant coat member, the remaining 10 pieces of heat-resistant coat member were not put in a bag, and were subjected to an accelerated test in which they were left in an environment tester at a temperature of 40° C. and a humidity of 90% for one month (heat-resistant coat member of Reference Example 2).

With respect to the heat-resistant coat member packaged bodies of Comparative Example 3 and Comparative Example 4, the polyethylene bag was opened, the heat-resistant coat member was put into a vapor deposition apparatus and heated to 200° C. at a temperature increase rate of 20° C./min. As a result, with respect to the heat-resistant coat member packaged body of Comparative Example 3, peeling of the pyrolytic boron nitride film occurred in two out of ten pieces of heat-resistant coat member. In addition, a trace of rubbing with the polyethylene bag was visually observed on the heat-resistant coat member. On the other hand, with respect to the heat-resistant coat member packaged body of Comparative Example 4, peeling of the pyrolytic boron nitride film occurred in four out of ten pieces of heat-resistant coat member. In addition, a trace of rubbing with the polyethylene bag was visually observed on the heat-resistant coat member.

The heat-resistant coat member of Reference Example 2 was put into a vapor deposition apparatus and heated to 200° C. at a temperature increase rate of 2° C./min. As a result, peeling of the pyrolytic boron nitride film did not occur in all of the ten pieces of heat-resistant coat member of Reference Example 2. In this case, the time required to raise the temperature to 200° C. was about 10 times the time required to raise the temperature to 200° C. in Example 2.

Comparative Examples 5 and 6

In the same manner as in Example 3, a heater substrate was coated with a pyrolytic boron nitride film, and 20 pieces of heat-resistant coat member were produced. Of these 20 pieces of heat-resistant coat member, 10 pieces of heat-resistant coat member were each put into a polyethylene bag having a water vapor permeability of 0.4 g/m²·day, and the polyethylene bag was hermetically sealed and packaged by heat-sealing with a heat-sealing sealer while evacuating the inside of the polyethylene bag, thereby producing a heat-resistant coat member packaged body of Comparative Example 5.

In addition, of the 20 pieces of heat-resistant coat member, the remaining 10 pieces of heat-resistant coat member were each put into a polyethylene bag having a water vapor permeability of 1 g/m²·day, and hermetically sealed and packaged by heat-sealing with a heat-sealing sealer while evacuating the inside of the polyethylene bag, thereby producing a heat-resistant coat member packaged body of Comparative Example 6.

The heat-resistant coat member packaged bodies of Comparative Example 5 and Comparative Example 6 were subjected to an accelerated test in which they were left in an environment tester at a temperature of 40° C. and a humidity of 90% for one month. Thereafter, the polyethylene bag was opened, and the heat-resistant coat member was set in a film forming apparatus and electrically heated to 1000° C. at a temperature increase rate of 20° C./min. As a result, with respect to the heat-resistant coat member packaged body of Comparative Example 5, peeling of the pyrolytic boron nitride film occurred in three out of ten pieces of heat-resistant coat member. Further, with respect to the heat-resistant coat member packaged body of Comparative Example 6, peeling of the pyrolytic boron nitride film occurred in six out of ten pieces of heat-resistant coat member.

In the above Examples and Comparative Examples, a wafer tray and a heater were used as the substrate. However, the present invention is not limited thereto, and a similar tendency was observed in a raw material-melting crucible, a reaction container, a heat-shielding member, and a crucible for pulling a single crystal. In the above-described Examples and Comparative Examples, the heat-resistant material coating the substrate was pyrolytic boron nitride. However, a similar tendency was observed in carbon-added pyrolytic boron nitride, pyrolytic carbon, boron-added pyrolytic boron nitride, SiC, and TaC.

The invention claimed is:

1. A heat-resistant coat member packaged body comprising:
   a heat-resistant coat member formed by coating a substrate composed of at least one material selected from the group consisting of pyrolytic boron nitride and graphite with a heat resistant material; and
   a bag member that accommodates the heat-resistant coat member, wherein the bag member has a water vapor permeability of 0.3 g/m²·day or less,
   wherein the water vapor permeability of the bag member is measured in accordance with the standard of JIS K 7129, determined under conditions of 40° C. and 90% humidity,
   wherein the bag member is sealed under the condition in which the inside of the bag member is evacuated with the heat-resistant coat member therein, and
   wherein the inner surface of the bag member has an average roughness (Ra) of 13 μm or less determined in accordance with the standard of JIS B 0601.

2. The heat-resistant coat member packaged body according to claim 1, wherein the heat-resistant coat member is a heat-resistant coat member formed by coating the substrate with the heat-resistant material two or more times.

3. The heat-resistant coat member packaged body according to claim 1, wherein the heat-resistant material is at least one heat-resistant material selected from the group consisting of pyrolytic boron nitride, carbon-added pyrolytic boron nitride, pyrolytic carbon, boron-added pyrolytic boron nitride, SiC, and TaC.

4. The heat-resistant coat member packaged body according to claim 1, wherein the bag member comprises a gas barrier film obtained by depositing at least one selected from the group consisting of aluminum, alumina, and silica on a plastic film.

5. A method for packaging a heat-resistant coat member, comprising:
   positioning a heat-resistant coat member comprising a substrate coated with a heat-resistant material within a bag member having a water vapor permeability of 0.3 g/m²·day or less, and
   sealing the bag member having the heat-resistant coat member accommodated therein under the condition in which the inside of the bag member is evacuated;
   wherein the substrate is composed of at least one material selected from the group consisting of pyrolytic boron nitride and graphite,
   wherein the water vapor permeability of the bag member is measured in accordance with the standard of JIS K 7129, determined under conditions of 40° C. and 90% humidity, and wherein the inner surface of the bag member has an average roughness (Ra) of 13 μm or less determined in accordance with the standard of JIS B 0601.

\* \* \* \* \*